US012777857B2

(12) United States Patent
Liu et al.

(10) Patent No.: US 12,777,857 B2
(45) Date of Patent: Oct. 27, 2026

(54) BY-SITE-COMPENSATED ETCH BACK FOR LOCAL PLANARIZATION/TOPOGRAPHY ADJUSTMENT

(71) Applicant: Taiwan Semiconductor Manufacturing Company, Ltd., Hsinchu (TW)

(72) Inventors: Ming Chyi Liu, Hsinchu City (TW); Hung-Wen Hsu, Tainan City (TW); Min-Yung Ko, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/782,475

(22) Filed: Jul. 24, 2024

(65) Prior Publication Data

US 2024/0387185 A1 Nov. 21, 2024

Related U.S. Application Data

(60) Continuation of application No. 18/366,074, filed on Aug. 7, 2023, which is a division of application No.
(Continued)

(51) Int. Cl.
*H10P 50/24* (2026.01)
*H01J 37/32* (2006.01)
(Continued)

(52) U.S. Cl.
CPC ...... *H10P 50/242* (2026.01); *H01J 37/32724* (2013.01); *H10P 50/267* (2026.01);
(Continued)

(58) Field of Classification Search
CPC ............. H01L 21/30604; H01L 21/304; H01L 21/02019; H01L 21/02024; H10P 50/24
See application file for complete search history.

(56) References Cited

U.S. PATENT DOCUMENTS 5,795,493 A * 8/1998 Bukhman ........... H01L 21/3065 216/60
5,989,929 A * 11/1999 Nikoh ................. H10P 72/0604 156/345.24

(Continued)

FOREIGN PATENT DOCUMENTS

JP 2007081160 A 3/2007
JP 2015162586 A 9/2015
TW 200414349 A 8/2004

OTHER PUBLICATIONS

Non-Final Office Action dated Jun. 23, 2023 for U.S. Appl. No. 17/144,628.

(Continued)

*Primary Examiner* — Thomas T Pham
(74) *Attorney, Agent, or Firm* — Eschweiler & Potashnik, LLC

(57) ABSTRACT

A work piece is positioned on a work piece support, which includes a plurality of temperature control zones. A pre-etch surface topography is determined by measuring a plurality of pre-etch surface heights or thicknesses at a plurality of sites on the work piece. The plurality of sites correspond to the plurality of temperature control zones on the work piece support. At least a first zone of the temperature control zones is heated or cooled based on the measured plurality of pre-etch surface heights or thicknesses, so that the first zone has a first temperature different from a second temperature of a second zone of the temperature control zones. A dry etch is carried out while the first zone has the first temperature different from the second temperature of the second zone of the temperature control zones.

20 Claims, 5 Drawing Sheets

100

Related U.S. Application Data

17/144,628, filed on Jan. 8, 2021, now Pat. No. 12,046,477.

(51) Int. Cl.

| | |
|---|---|
| ***H10P 50/26*** | (2026.01) |
| ***H10P 50/28*** | (2026.01) |
| ***H10P 50/64*** | (2026.01) |
| ***H10P 50/66*** | (2026.01) |
| ***H10P 72/00*** | (2026.01) |
| ***H10P 74/20*** | (2026.01) |

(52) U.S. Cl.

CPC .......... *H10P 50/283* (2026.01); *H10P 50/287* (2026.01); *H10P 50/642* (2026.01); *H10P 50/667* (2026.01); *H10P 72/0421* (2026.01); *H10P 72/0424* (2026.01); *H10P 72/0434* (2026.01); *H10P 72/0602* (2026.01); *H10P 72/0604* (2026.01); *H10P 74/203* (2026.01); *H01J 2237/334* (2013.01)

(56) References Cited

U.S. PATENT DOCUMENTS

| | | | |
|---|---|---|---|
| 6,746,616 | B1 | 6/2004 | Fulford et al. |
| 7,122,126 | B1 | 10/2006 | Fuentes |
| 2003/0141275 | A1 | 7/2003 | Rushford et al. |
| 2003/0186545 | A1 | 10/2003 | Kamp et al. |
| 2004/0182822 | A1 | 9/2004 | Chen et al. |
| 2005/0090093 | A1 | 4/2005 | Bailey, III et al. |
| 2005/0211385 | A1* | 9/2005 | Benjamin ......... H01L 21/67069 156/345.52 |
| 2007/0298585 | A1 | 12/2007 | Lubomirsky et al. |
| 2008/0081383 | A1 | 4/2008 | Chen et al. |
| 2011/0143462 | A1 | 6/2011 | Gaff et al. |
| 2012/0074126 | A1 | 3/2012 | Bang et al. |
| 2014/0220709 | A1 | 8/2014 | Kimura et al. |
| 2017/0186730 | A1* | 6/2017 | Shen ........................ H01L 24/32 |
| 2017/0301611 | A1* | 10/2017 | Cheng ............... H01L 21/76898 |
| 2018/0047645 | A1 | 2/2018 | Varadarajan et al. |
| 2018/0114713 | A1* | 4/2018 | Drab .................. H01L 21/6835 |
| 2018/0148322 | A1* | 5/2018 | Maier ................. B81C 1/00301 |
| 2018/0337160 | A1 | 11/2018 | Drab et al. |
| 2019/0035636 | A1 | 1/2019 | Yoshimizu et al. |
| 2022/0020665 | A1* | 1/2022 | Li ......................... H10W 20/20 |

OTHER PUBLICATIONS

Final Office Action dated Oct. 5, 2023 for U.S. Appl. No. 17/144,628.

Notice of Allowance dated Mar. 4, 2024, for U.S. Appl. No. 17/144,628.

Non-Final Office Action dated May 7, 2026 for U.S. Appl. No. 18/366,074.

* cited by examiner

BY-SITE-COMPENSATED ETCH BACK FOR LOCAL PLANARIZATION/TOPOGRAPHY ADJUSTMENT

REFERENCE TO RELATED APPLICATIONS

This Application is a Continuation of U.S. application Ser. No. 18/366,074, filed on Aug. 7, 2023, which is a Divisional of U.S. application Ser. No. 17/144,628, filed on Jan. 8, 2021 (now U.S. Pat. No. 12,046,477, issued on Jul. 23, 2024). The contents of the above-referenced Patent Applications are hereby incorporated by reference in their entirety.

BACKGROUND

Over the last four decades, the density of integrated circuits has increased by a relation known as Moore's law. Stated simply, Moore's law says that the number of transistors on integrated circuits (ICs) doubles approximately every 18 months. Thus, as long as the semiconductor industry can continue to uphold this simple "law," ICs double in speed and power approximately every 18 months. In large part, this remarkable increase in the speed and power of ICs has ushered in the dawn of today's information age.

Unlike laws of nature, which hold true regardless of mankind's activities, Moore's law only holds true only so long as innovators overcome the technological challenges associated with it. For example, etch back techniques have been developed in recent years to "thin down" semiconductor wafers, and can be used in a number of different circumstances in semiconductor manufacturing. For example, wafers can be thinned in order to help improve quantum efficiencies for photodetectors, to help a completed IC to fit within a given package, among other reasons.

DETAILED DESCRIPTION

Figure 1:
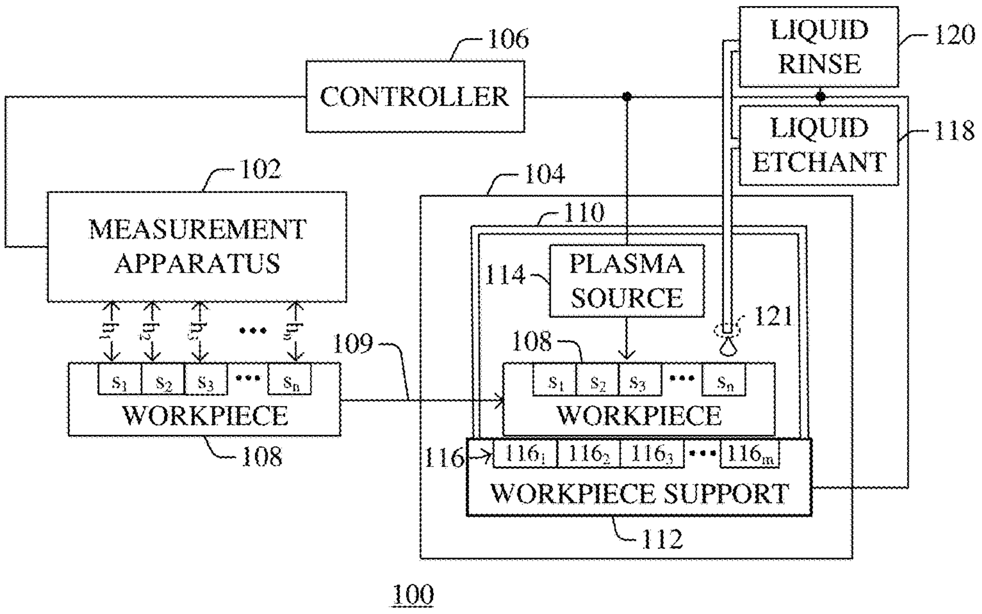
FIG. 1 illustrates a block diagram of a system in accordance with some embodiments of the present disclosure.

The present disclosure provides a system and apparatus for providing a thermal uniformity across a work piece. Accordingly, the description is made with reference to the drawings, in which like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Etch back procedures by which one or more layers on a semiconductor wafer (and/or the wafer itself) can be "thinned" down are used in a wide variety of contexts in semiconductor processing. For example, an ideal etch back procedure can begin with a layer whose uppermost surface is substantially uniform in height and/or thickness over the entire face of a wafer, and can end with a thinned down version of the layer whose etched back uppermost surface is still substantially uniform in height over the entire face of the wafer (albeit the height and/or thickness of the thinned down version of the layer is much less than the height and/or thickness of the original layer). Thus, in an ideal case the etch back procedure uniformly removes material from the entire uppermost surface of the layer. Unfortunately, in real world cases, etch back procedures suffer from small non-uniformities in removal rate, such that there are small variations in the height and/or thickness of etched back layers, due to small random variations in etch conditions, material non-uniformities, etc. Accordingly, the present disclosure provides for improved localized etch back procedures that have more uniform removal rates than previous approaches.

FIG. 1 illustrates an etching system 100 in accordance with some embodiments that achieves more uniform removal rates than previous approaches. The etching system 100 includes a measurement apparatus 102 and a localized etch back apparatus 104, both of which are controlled by a controller 106. The localized etch back apparatus 104 is downstream of the measurement apparatus 102, such that a work piece 108 can be first processed by the measurement apparatus 102 and then is moved (see line 109) to localized etch back apparatus 104 by a robotic assembly and/or conveyor. The localized etch back apparatus 104 then processes the work piece 108 to provide uniform removal through a localized etch back procedure.

The measurement apparatus 102 is configured to determine a plurality of pre-etch surface heights or thickness ($h_1$, $h_2$, $h_3$, . . . $h_n$) on an upper surface of the work piece 108 at a plurality of sites on the upper surface ($S_1$, $S_2$, $S_3$, . . . , $S_n$, respectively) where n can be any positive number. The sites are often predetermined areas that are equal in size with one another, and can be arranged in an array of columns and rows on the upper surface of the work piece. In some embodiments, for example, the measurement apparatus 102 can include a tunneling electron microscope (TEM), scanning electron microscope, an atomic force microscope (AFM), or some other device to measure the height or thickness of the upper surface of the work piece 108 at each site. The height or thickness measurement for the sites can be performed in serial by a single measurement device or can be performed in parallel by many measurement devices that take measurements concurrently on the upper surface of the work piece 108. Ideally, in many cases the upper surface of each work piece 108 passing through the system 100 would have a uniform height or thickness over its entire upper surface (e.g., the upper surface would be planar or flat). However, due to real-world manufacturing variations and tolerances, the upper surface of each work piece 108 may include some regions with peaks and other regions with valleys. Thus, the overall height and/or thickness of the upper surfaces of semiconductor work pieces 108 can vary in a somewhat random and/or unpredictable fashion from one another. This may be referred to as random-by-site, meaning that each semiconductor work piece has an upper surface with various heights and/or thicknesses at the various sites.

The localized etch back apparatus 104, which is downstream of the measurement apparatus 102 is configured to etch back the upper surface of the work piece 108 to "thin" the work piece 108 so the various sites are etched at slightly different rates based on their measured heights. Thus, this localized etch back apparatus 104 provides the work piece 108 with a post-etch upper surface that has a substantially uniform height or thickness over the entire upper surface of the work piece 108.

More particularly, the localized etch back apparatus 104 includes a housing configured to retain the work piece within a vacuum chamber 110, a work piece support 112 disposed within the vacuum chamber 110 and configured to support the work piece 108, and a plasma source 114 within the vacuum chamber 110. The face of the work piece support 112 includes a plurality of temperature control zones with a plurality of temperature control elements ($116_1$, $116_2$, $116_3$, . . . , $116_m$), respectively, where m can be any positive number. In some embodiments, m can be equal to n, such that there is a one to one correspondence between the number of measurement sites ($s_1$, $s_2$, $s_3$, . . . $s_n$) and the number of temperature control elements ($116_1$, $116_2$, $116_3$, . . . , $116_m$), but in other cases n is greater than m or n is less than m.

The plasma source 114 is configured to generate ions to etch the work piece 108 while the work piece 108 is supported on the work piece support 112. For example, the plasma source 114 can comprise fluorine reactants, such as CF4, CH3F4, or C4F8 for etching dielectric materials, and/or can comprise Cl2, HB4, and/or Ar reactants for etching conductive films such as polysilicon or metal.

The controller 106 is configured to individually heat or cool the plurality of temperature control elements $116_1$, $116_2$, $116_3$, . . . , $116_m$ to heat or cool the plurality of temperature control zones, respectively, to a first plurality of temperatures, respectively, while the plasma source 114 is generating the ions to etch the work piece 108 and while the work piece 108 is supported on the work piece support 112. The first plurality of temperatures are based on the measured plurality of pre-etch surface heights or thicknesses, respectively. For example, for some sites that are measured to have higher heights and/or larger thicknesses, the temperature control zones corresponding to those sites can be heated during plasma etching. Conversely, for other sites that are measured to have lower heights and/or smaller thicknesses, the temperature control zones corresponding to those sites can be cooled during the plasma etching. By providing this individual heating and/or cooling of the temperature control elements during an in situ plasma etch, the system 100 can tailor the etch rates for the individual sites on the work piece 108 to "tune" the plasma etching and provide the work piece 108 with a post-etch topography that is the more uniform than previously achievable. Each temperature control element can also include or more temperature sensors configured to measure a temperature of the temperature control zone, thereby providing feedback to the controller 106 to accurately heat and/or cool the temperature control elements until the first plurality of temperatures are reached.

In some examples, the controller 106 is configured to predict a temperature of the work piece 108 at one or more of the sites on the work piece, wherein the controller is further configured to activate one or more of the plurality of temperature control elements based, at least in part, on the prediction of the temperature of the work piece at sites. For example, because heat may dissipate more quickly at edges of the work piece 108 compared to the center of the work piece 108, the controller 106 may take this into account such that sites near an edge of the work piece are heated slightly more than sites in the center of the work piece, given equal height and/or thicknesses.

In addition to and/or in place of using the temperature control elements $116_1$, $116_2$, $116_3$, . . . , $116_m$ and plasma source 114, localized etch back techniques can make use of a liquid etchant dispensing element 118 and a rinse dispensing element 120. In some embodiments, the liquid etchant dispensing element 118 and rinse dispensing element 120 can include separate tanks that make use of a single (shared) nozzle 121, while in other embodiments the liquid etchant dispensing element 118 and rinse dispensing element 120 can share multiple nozzles and/or use separate nozzle(s) from one another. The liquid etchant dispensing element 118 can comprise hydrofluoric acid (HF) to etch silicon dioxide or other oxides; HF, H3PO4, and/or chemical dry etch (CDE) to etch silicon nitride or silicon oxynitride; an alkali liquid such as Tetramethylammonium hydroxide (TMAH) or NH4OH to etch polysilicon; and/or hydrochloric acid (HCl), NH4OH, sulfuric peroxide mixture (SPM), Ammonia/Peroxide mix (APM), and/or Hydrochloric/Peroxide mix (HPM) to etch metal. During operation, a nozzle-positioning-assembly, such as a robotic arm, can position the nozzle(s) corresponding to the liquid etchant dispensing element 118 directly over a site that has been measured to have a large height and/or large thickness. Alternatively, nozzle(s) corresponding to the liquid etchant dispensing element 118 can remain fixed, and the work piece support 112 can move the site that has been measured to have the large height and/or large thickness directly under the nozzle(s) of the liquid etchant dispensing element 118. When nozzle(s) of the liquid etchant dispensing element 118 is in position over the desired site, the controller 106 can induce the liquid etchant dispensing element 118 to dispense the liquid etchant onto only the site (and not on other adjacent sites) while the work piece 108 is stationary with respect to the liquid etchant dispensing element 118, such that the height and/or thickness of the work piece 108 at the site is reduced relative to the heights and/or thicknesses of other sites on the work piece 108. Once the liquid etchant is determined to have reduced the height and/or thickness by a desired amount, which can be achieved by applying the liquid etchant for a predetermined time or by actively measuring the thickness and/or height while the liquid etchant is present on the upper surface of the work piece 108, the controller 106 can induce the rinse dispensing element 120 to apply the liquid rinse, such as deionized water, to rinse the liquid etchant from the work piece 108. This allows the system 100 to tailor the etch back rates for the individual sites on the work piece 108 to provide the work piece 108 with a post-etch topography that is the more uniform than previously achievable.

Figure 2A:
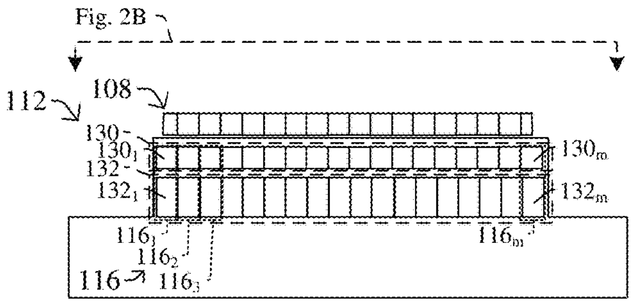
FIG. 2A illustrates a cross-sectional view of a work piece support in accordance with some embodiments of the present disclosure.
Figure 2B:
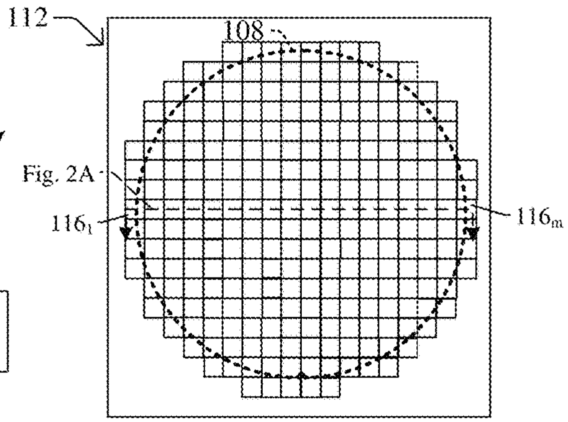
FIG. 2B illustrates a top view of a work piece support in accordance with some embodiments of the present disclosure.

Referring briefly to FIG. 2A-2B, one can see a cross-sectional view (FIG. 2A) and a corresponding top view (FIG. 2B) of the work piece support 112 including a plurality of temperature control zones. The work piece support 112 comprises a generally planar surface whereon the work piece 108 resides. The generally planar surface contracts an entirety of a backside surface of the work piece. The temperature control zones can include corresponding temperature control elements 116, which can include a plurality of individual heating elements 130 and a plurality of individual cooling elements 132. For example, a first temperature control elements $116_1$ can include a first individual heating element $130_1$ and a first individual cooling element $132_1$. A mth temperature control element 116*m* can include an mth individual heating element 130*m* and an mth individual cooling element 130*m*. In some embodiments, the plurality of temperature control elements 116 comprise a plurality of thermal conduits configured to pass a fluid through a body of the work piece support 112. Thus, the body of the work piece support 112 may comprise plastic or metal, for example, and the thermal conduits are channels or voids in the plastic or metal that enable fluid flow through the body. The fluid, for example, can comprise a cooling fluid or a heating fluid, based on the desired temperature for the sites. In other embodiments, each of the plurality of temperature control elements 116 comprise a heat pipe and/or a Peltier device, wherein the heat pipe and/or Peltier device are configured to individually cool and/or individually heat the sites on the work piece 108 based on the measured heights or thicknesses of the respective sites. In still other embodiments, temperature control elements 116 comprise electric coils through which the controller 106 induces varying levels of current to control heating, wherein each electric coil is configured to individually heat a corresponding site on the work piece 108 based on the measured heights or thicknesses of that site. Again, because the temperature of the individual heating and/or cooling elements can be controlled based on the measured heights and/or thicknesses at the sites on the upper surface of the work piece 108, the system 100 induces uniform etching back of the work piece.

Figure 3:
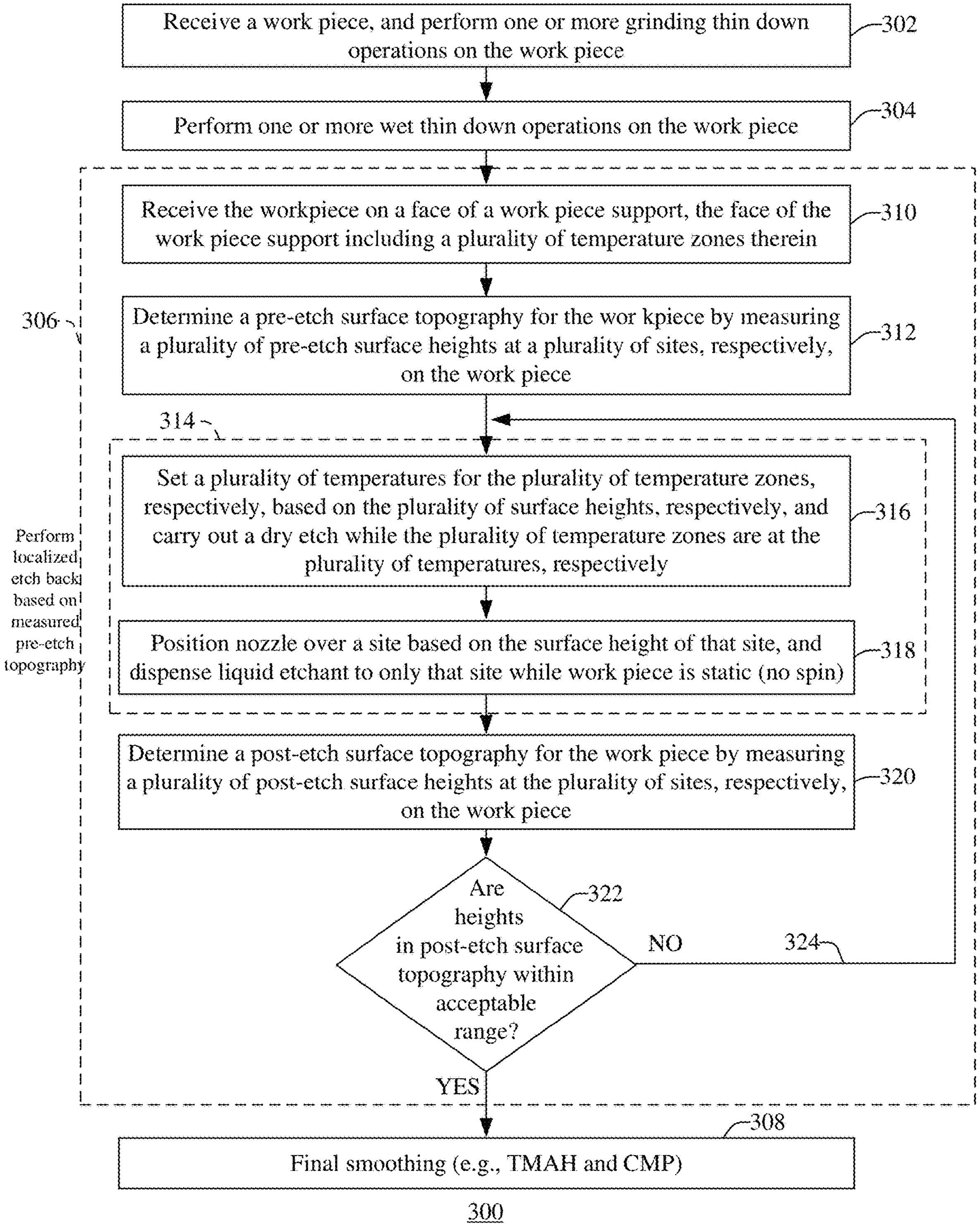
FIG. 3 illustrates a flow chart of a methodology for providing a uniform etch back across a work piece.

Turning now to FIG. 3, one can see a flow diagram of a method 300 for thinning a work piece in accordance with some embodiments of the present disclosure. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 300 begins at 302, when a work piece is received, and one or more grinding operations are carried out to thin down the work piece.

Figure 4A:
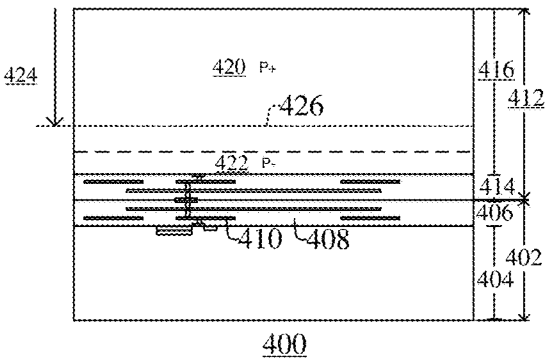
FIGS. 4A-7 depict a series of cross-sectional views in accordance with some embodiments at various stages in a methodology for providing a uniform etch back.
Figure 4B:
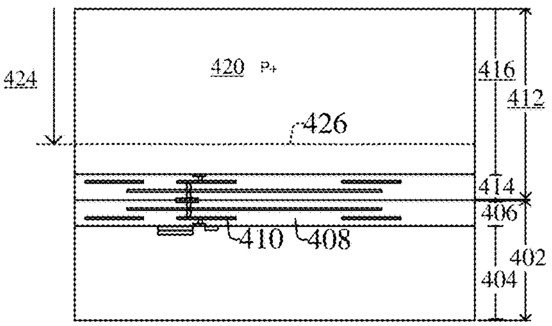

Referring briefly to FIGS. 4A-4B, one can see examples of some embodiments of receiving a work piece, and carrying out one or more grinding operations to thin down the work piece, consistent with some examples of act 302.

In FIG. 4A, for example, a work piece 400 in accordance with some embodiments is provided. The work piece 400 manifests as a three-dimensional integrated circuit including at least two integrated circuit structures having separate semiconductor substrates. Thus, the work piece 400 includes a first integrated circuit structure 402 including a first semiconductor substrate 404 and a first interconnect structure 406. The first semiconductor substrate 404 is a monocrystalline silicon substrate in some embodiments, or alternatively is a silicon-on-insulator (SOI) substrate. The first interconnect structure 406 includes a dielectric structure 408, and a plurality of metal lines 410 stacked over one another and connected to one another through contacts and vias in the first interconnect structure. A second integrated circuit structure 412 includes a second interconnect structure 414 disposed over the first interconnect structure 406, and a second semiconductor substrate 416 disposed over the second interconnect structure 414. In some embodiments, the first semiconductor substrate 404 includes an array of pixels, each of which includes a photodetector, and the second semiconductor substrate 416 includes dynamic random access memory (DRAM) cells. Further, in some embodiments, the second semiconductor substrate 416 has a total thickness ranging from approximately 500 microns to approximately 1000 microns, and which is approximately 776 microns thick in some embodiments. In the embodiment of FIG. 4A, the second semiconductor substrate 416 includes a relatively thick P+ region 420 (that ranges from approximately 95% to approximately 99.8% of the total thickness of the second semiconductor substrate 416), and a relatively thin P− region 422. In some embodiments, the thick P+ region 420 has a thickness of approximately 765 microns, and the P− region 422 has a thickness of approximately 10 microns, for example.

In FIG. 4A, a grinding operation (see arrow 424) is performed on the work piece 400 to reduce a thickness of the second semiconductor substrate 416 from approximately 775 micrometers to approximately 20 micrometers. The grinding operation can end at height 426, which can be met when a predetermined duration for the grinding operation is met or can be met when active monitoring of the height or thickness indicates this height has been reached. To carry out the grinding operation, the work piece 400 is received such that a backside of the first semiconductor substrate 404 resides directly on a work piece chuck. The backside of the second semiconductor substrate 416 faces a grind wheel, such as a diamond and resin bonded grind wheel, that is mounted on a spindle. The grind wheel and/or work piece chuck rotate with respect to one another while a downward force is applied to the backside of the second semiconductor substrate 416 by the grind wheel, while a liquid such as deionized water is directed onto the backside of the second semiconductor substrate 416 to provide cooling and wash away material particles generated during the grinding operation.

FIG. 4B illustrates a work piece that is similar to that of FIG. 4A, except that in FIG. 4B the second semiconductor substrate 416 lacks the P− region 422 of FIG. 4A. Thus, in FIG. 4B, the second semiconductor substrate 416 is P+ material from its upper surface to the upper surface of the second interconnect structure 414. Again, a grinding operation (see arrow 424) is performed on the work piece to reduce a thickness of the second semiconductor substrate 416 from approximately 775 micrometers to approximately 20 micrometers. The grinding operation can end at height 426, which can be met when a predetermined duration for the grinding operation is met or can be met when active monitoring of the height or thickness indicates this height has been reached.

Referring back to FIG. 3, in 304, one or more wet or dry etches are carried out to further thin the substrate and substantially remove grinding defects, such as ridges, pits, or cracks due to the grinding operation.

Figure 5A:
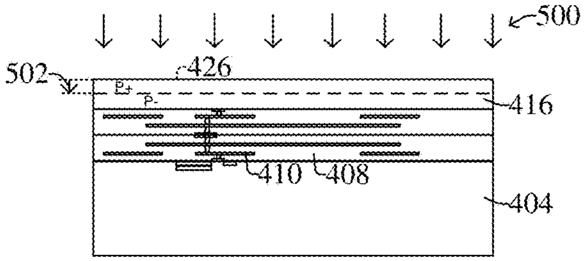

Some embodiments of act 304 are depicted in FIG. 5A, where a selective wet etch 500 is carried out. The selective wet etch 500 stops on the interface where the p+ region 420 meets the p− region 422. For example, the selective etch 500 can include HNA, which is a mixture of HF, HNO3, and acetic acid. In some embodiments, the selective wet etch reduces (see arrow 502) the thickness of the second semiconductor substrate 416 from about 20 microns to between 10 microns and 1 micron. The embodiment of FIGS. 4A-5A, whereby the interface between the P+ region 420 and P− region 422 corresponds to the stopping point for the selective wet etch 500, is advantageous in that it provides a better (smaller) total thickness variation (TTV) compared to the embodiment of FIGS. 4B-5B.

Figure 5B:
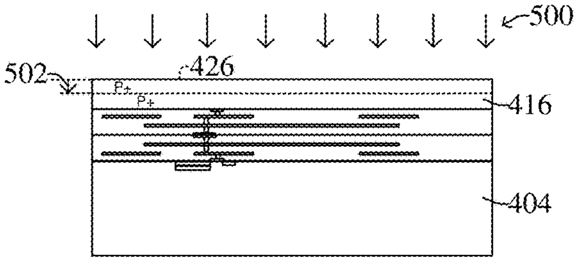

FIG. 5B illustrates an alternative embodiment of act 304 which follows from FIG. 4B. In FIG. 5B, a non-selective thin down is carried out in the form of a dry etch followed by wet thin down to a predetermined height whereby the thickness of the second semiconductor substrate is reduced from about 20 microns to between 10 microns and 1 micron. The embodiment of FIGS. 4B-5B, whereby the second semiconductor substrate includes solely a P+ region is advantageous in that it provides a streamlined process in that it does not require formation of separate P+ and P− regions, compared to the embodiment of FIGS. 4A-5A.

Figure 6:
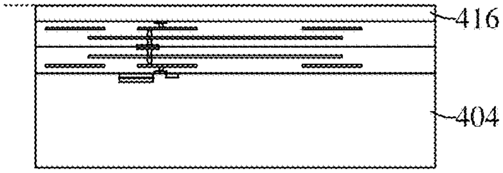
Figure 7:

Referring back to FIG. 3, in 306, a localized etch back procedure is carried out to make the planarity and/or thickness of the second semiconductor substrate more uniform than some other processes. An example of a localized etch back procedure is illustrated in FIG. 6, wherein the localized etch back procedure can remove 50 angstroms to 1000 angstroms of P− material from the upper surface of the second semiconductor substrate. This localized etch back procedure can heat and/or cool various sites on the second semiconductor substrate 416 to different temperatures during dry etching, and/or can utilized localized wet etching to provide an etch back that is more uniform than other approaches.

In 308 of FIG. 3, one or more final smoothing operations are carried out to provide a post-etch surface topography that is extremely smooth or level. For example, the final thickness of the second semiconductor substrate can be approximately 3 microns, with a post etch surface that exhibits a wafer-in-wafer total thickness variation of between 0.1 microns and 0.5 microns, with the total thickness variation being less than 0.3 microns and greater than 100 angstroms in some embodiments. In some cases, the rate of removal uniformity is less than 0.04%, meaning for example that if the second semiconductor substrate started with a thickness of 776 microns and the final backside had a thickness of 3 microns with variations of about 0.3 microns over the entire backside of the second semiconductor substrate. This is at least partially due to the use of the localized etch back process 306, of which more detailed examples are now provided.

More particularly, the localized etch back process 306 begins at 310 when the work piece is positioned on a face of a work piece support. The face of the work piece support includes a plurality of temperature control zones having a plurality of temperature control elements, respectively. The plurality of temperature control elements are configured to individually heat or cool the plurality of temperature control zones, respectively.

Figure 8:
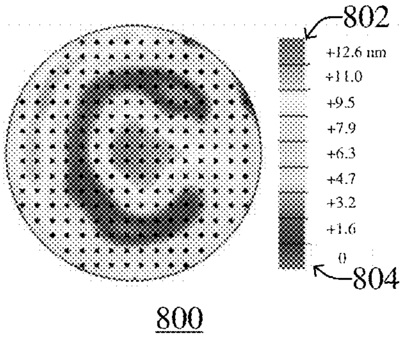
FIGS. 8-11 depict a series of top views in accordance with some embodiments at various stages in a methodology for providing a uniform etch back.

At 312, a pre-etch surface topography is determined for the work piece by measuring a plurality of pre-etch surface heights at a plurality of sites, respectively, on the work piece. In some embodiments, the plurality of sites on the work piece correspond to the plurality of temperature control zones on the face of the work piece support. FIG. 8 shows an example of one such pre-etch surface topography 800 for a work piece, where the left portion of FIG. 8 shows a top view of a work piece and the right portion shows how different colors or shading correspond to different heights or thicknesses of the workpiece. As shown, the work piece includes a plurality of sites arranged in a grid over the face of the work piece. Some of the sites have a larger height or are thicker (as shown by 802), while other sites have a smaller height or are thinner (as shown by 804). In the illustrated example, the lower or thinner areas form a "C" shape, and a central region of the work piece is higher or thicker, but other work pieces can have other pre-etch surface topographies that vary from this pattern.

Referring back to FIG. 3, in 314, a localized etch back using selective etching for different sites is carried out.

Figure 9:
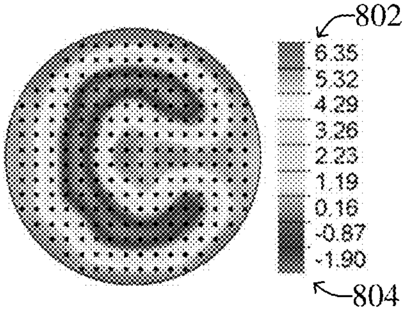
Figure 10:
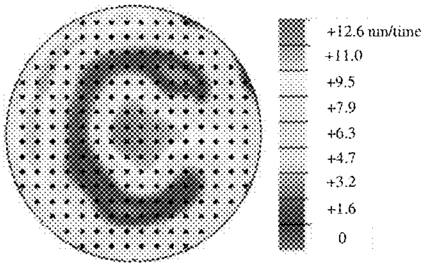

In some implementations (see act 316), act 314 is realized when the plurality of temperature control elements are used to heat or cool the plurality of temperature control zones, respectively, to a first plurality of temperatures, respectively. The first plurality of temperatures are based on the measured plurality of pre-etch surface heights, respectively, and a first dry etch is carried out while the plurality of temperature control elements are heated or cooled. FIGS. 9-10 show an example of one such localized etch back is used where different sites are heated to different temperatures based on their measured heights or thicknesses, and where etching is carried out while the sites are heated to different temperatures based on those measured heights or thicknesses to achieve localized etch back. FIG. 9 shows a heating map of the sites on the work piece that is based on the measured heights and/or thicknesses. In the illustrated example of FIG. 9, the sites that were measured to be lower or thinner (e.g., 804 in the "C" shape of FIG. 8) are active cooled by 1.9 degrees Celsius to slow the etching rate for these sites. Other sites, for example in the center of the work piece (e.g., 802 in FIG. 8) are concurrently heated by 6.4 degrees Celsius to increase the etching rate for these sites. In addition to being based on the measured heights, the heating and/or cooling of these sites can be based on a model of the workpiece support and/or a model of the wafer that predicts how heat is transferred from the temperature control elements to the workpiece support and/or wafer. For example, even though the outer edge regions of the work piece were not particularly low or thin, because these edge regions of are predicted by the model to dissipate heat more quickly due to their edge location where heat will naturally be dissipated more quickly, the edge regions of the work piece are also heated, as the model may indicate these regions would otherwise have a lower etching rate, resulting in a non-uniform etching over the entire surface of the workpiece. FIG. 10 shows the corresponding etch rate map when a plasma etch is carried out while the heating map of FIG. 9 is applied. As shown, the plasma etch has a faster etch rate for taller or thicker areas due to the heating of those sites, and has a slower etch rate for lower or thinner areas due to their active cooling.

In other approaches (see act 318), act 314 is realized when a nozzle is positioned over a site the plurality of sites based on the surface height of that site, and liquid etchant is dispersed through the nozzle to etch only that site while the work piece is stationary with respect to the work piece support. The plurality of temperature control elements are used to heat or cool the plurality of temperature control zones, respectively, to a first plurality of temperatures, respectively, such that while the liquid etchant is present on the site the temperature control zones are at the first plurality of temperatures. The first plurality of temperatures are based on the measured plurality of pre-etch surface heights, respectively, and a first wet etch is carried out while the plurality of temperature control elements are heated or cooled. This localized etching using the liquid etchant can also use active heating or cooling to adjust the etch rate of the liquid etchant in some embodiments, but in other embodiments active heating and cooling is not used with the liquid etchant to simplify processing.

Figure 11:
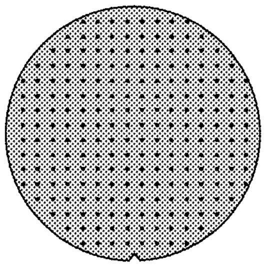

In 320, the method determines a post-etch surface topography for the work piece by measuring a plurality of post-etch surface heights at the plurality of sites, respectively, on the work piece. FIG. 11 shows an example of a work piece with a post-etch topography that is substantially uniform over the entire face of the work piece.

In 322 the method determines whether a plurality of measured post-etch surface heights in the post-etch surface topography fall within a predetermined acceptable range. When the plurality of measured post-etch surface heights in the post-etch surface topography fall outside the predetermined acceptable range, then act 324 is performed. That is, the plurality of temperature control elements are used to heat or cool the plurality of temperature control zones, respectively, to a second plurality of temperatures, respectively. The second plurality of temperatures are based on the measured plurality of post-etch surface heights, respectively, and carrying out a dry etch while the plurality of temperature zones are at the second plurality of temperatures, respectively. Thus, the localized etch back process may include multiple iterations in some cases.

FIGS. 12A-12C and 13A-13C show some embodiments where a localized etch back process includes multiple iterations. These embodiments are shown as a series of charts which represent cross-sectional views over the face of a work piece in time, with the Y-axis representing the height or thickness of the work piece and the X axis representing various adjacent sites (e.g., $s_1$, $s_2$, $s_3$, $s_4$, $s_5$) on the face of the work piece.

Figure 12A:
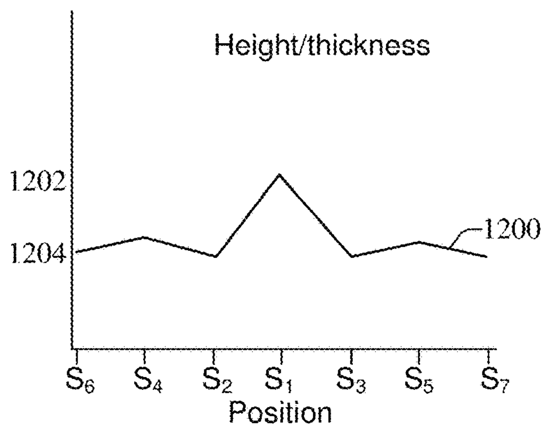
FIGS. 12A-12C and 13A-13C illustrate some embodiments where localized etch back processes include multiple iterations.
Figure 12B:
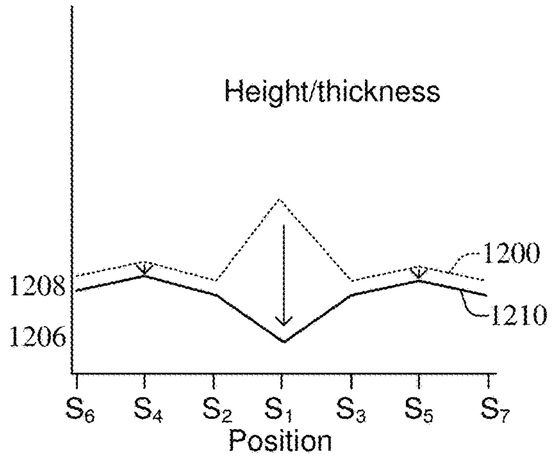
Figure 12C:
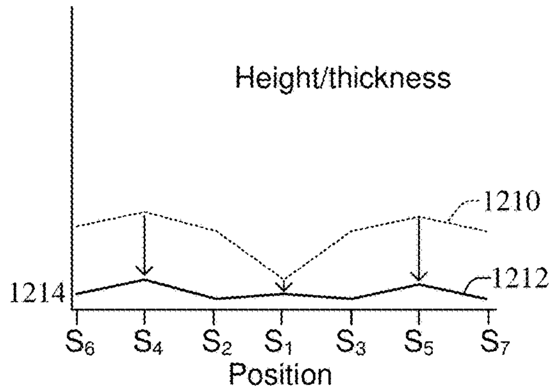

FIG. 12A illustrates a pre-etch surface topography 1200 where the heights or thicknesses of the work piece at various sites have been measured. The pre-etch surface topography 1200 includes a first site $s_1$ that has been measured to have a first height 1202 and second and third sites $s_2$, $s_3$, that have been measured to have a second height 1204 on either side of the first site. The first height 1202 is greater than the second height 1204, such that the first site $s_1$ corresponds to a "peak" on the work piece. In FIG. 12B, the sites are heated and/or cooled based on their measured heights or thicknesses, and a first dry etch is carried out while the heating and/or cooling is applied, thereby achieving a first iteration of etching back. For example, because the first site $s_1$ is initially higher than the second and third heights $s_2$, $s_3$ FIG. 12A, the first site $s_1$ is heated in FIG. 12B during the first dry etch (and/or the second and third sites $s_2$, $s_3$ are cooled during the first dry etch) to achieve localized etch back. As shown in FIG. 12B, application of the different temperatures leads to different etch rates for the various sites, such that the first dry etch reduces the first height of the first site to a third height 1206 and reduces the second height of the second and third sites to a fourth height 1208, wherein the third height is less than the fourth height. Thus, in the example of FIG. 12B, the applied temperature "over corrects" the peak of FIG. 12A, and results in the first site $s_1$ exhibiting a "valley" relative to the second and third sites $s_2$, $s_3$ in an updated etch surface topography 1210. The heights of the various sites in the updated etch surface topography 1210 in FIG. 12B are then measured. In FIG. 12C, temperatures applied to the various sites are adjusted based on the newly measured heights, and a second dry etch is carried out. In this second iteration, the second and third sites $s_2$, $s_3$ are heated (and/or the first site $s_1$ is cooled), such that the first site $s_1$ experiences a lower etch rate than the second and third sites. Consequently, the final post-etch topography 1212 include first, second, and third sites $s_1$, $s_2$, $s_3$ that each have a fifth height 1214, such that all sites on the entire face of the work piece exhibit a uniform height and/or thickness.

Figure 13A:
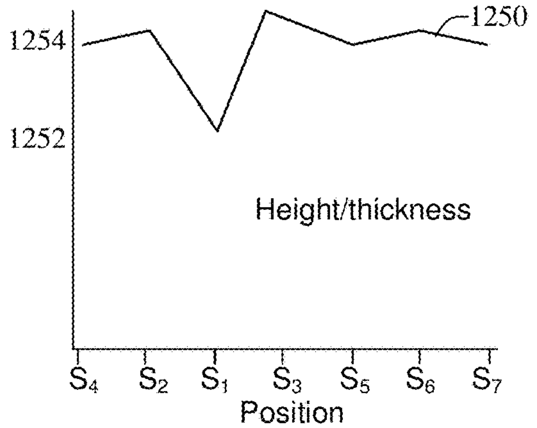
Figure 13B:
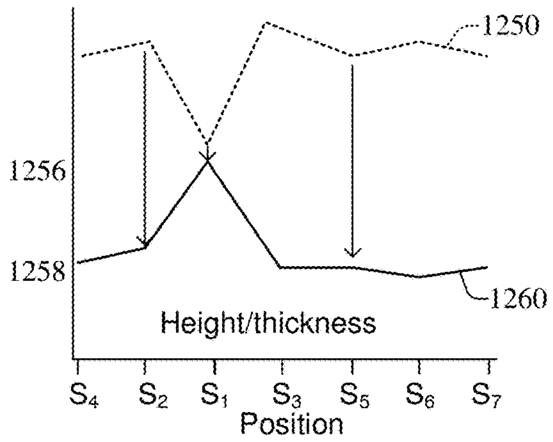
Figure 13C:
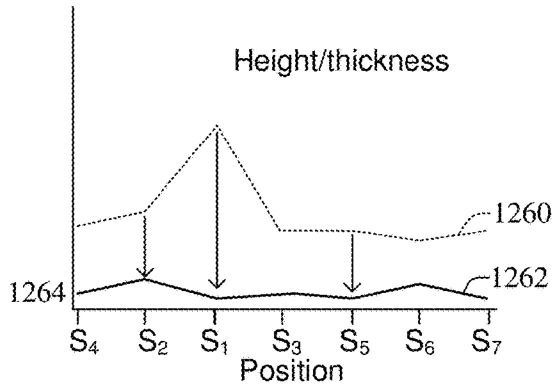

FIG. 13A illustrates another pre-etch surface topography 1250 where the heights or thicknesses of the work piece at various sites has been measured. The pre-etch surface topography 1250 includes a first site s1 that has been measured to have a first height 1252 and second and third sites s2, s3, that have been measured to have a second height 1254 on either side of the first site. In FIG. 13A's example, however, the first height 1252 is less than the second height 1254, such that the first site s1 corresponds to a "valley" on the work piece. In FIG. 13B, the sites are heated and/or cooled based on their measured heights or thicknesses, and a first dry etch is carried out while the heating and/or cooling is applied, thereby achieving a first iteration of etching back. For example, because the first site s1 is lower than the second and third sites s2, s3, the first site s1 is cooled during the plasma etching (and/or the second and third sites s2, s3 are heated during the first dry etch) to achieve localized etch back. As shown, application of the different temperatures leads to different etch rates for the various sites, such that the first dry etch reduces the first height of the first site s1 to a third height 1256 and reduces the second height of the second and third sites s2, s3 to a fourth height 1258, wherein the third height 1256 is greater than the fourth height 1258. Thus, in the example of FIG. 13B, the applied temperature "under corrects" the valley, and results in the first site s1 exhibiting a peak relative to the second and third sites s2, s3 in an updated etch surface topography 1260. The updated etch surface topography on FIG. 13B is then measured. In FIG. 13C, temperatures applied to the various sites are adjusted, and second dry etch is carried out. In this second iteration, the second and third sites s2, s3, are cooled (and/or the first site s1 is heated), such that the first site s1 experiences a higher etch rate than the second and third sites. Consequently, the final post-etch topography 1262 includes first, second, and third sites s1, s2, s3 that each have a fifth height 1264, such that all sites on the entire face of the work piece exhibit a uniform height and/or thickness.

Thus, some embodiments of the present disclosure relate to a method. In this method, a work piece is positioned on a face of a work piece support. The face of the work piece support includes a plurality of temperature control zones having a plurality of temperature control elements, respectively, configured to individually heat or cool the plurality of temperature control zones, respectively. A pre-etch surface topography is determined for the work piece by measuring a plurality of pre-etch surface heights or thicknesses at a plurality of sites, respectively, on the work piece. The plurality of sites on the work piece correspond to the plurality of temperature control zones on the face of the work piece support. The plurality of temperature control elements are used to heat or cool the plurality of temperature control zones, respectively, to a first plurality of temperatures, respectively. The first plurality of temperatures are based on the measured plurality of pre-etch surface heights or thicknesses, respectively, A first dry etch is carried out while the plurality of temperature control zones are heated or cooled to the first plurality of temperatures.

Some other embodiments of the present disclosure relate to an etching system. The etching system includes a measurement apparatus configured to receive a work piece. The measurement apparatus is configured to determine a plurality of pre-etch surface heights at a plurality of sites, respectively, on an upper surface of the work piece. A localized etch back apparatus is downstream of the measurement apparatus and configured to etch back the upper surface of the work piece to thin the work piece. The localized etch back apparatus includes a housing configured to retain the work piece; a work piece support disposed within the housing and configured to support the work piece, wherein a face of the work piece support includes a plurality of temperature control zones with a plurality of temperature control elements, respectively; and a plasma source configured to generate ions to etch the work piece while the work piece is supported on the work piece support. A controller is configured to individually heat or cool the plurality of temperature control elements to heat or cool the plurality of temperature control zones, respectively, to a first plurality of temperatures, respectively, while the plasma source is generating the ions to etch the work piece while the work piece is supported on the work piece support. The first plurality of temperatures are based on the measured plurality of pre-etch surface heights, respectively.

Still other embodiments relate to a semiconductor device including a first integrated circuit structure and a second integrated circuit structure. The first integrated circuit structure includes a first semiconductor substrate and a first interconnect structure. The first interconnect structure includes a dielectric structure, and a plurality of metal lines stacked over one another and connected to one another through contacts and vias in the first interconnect structure. The second integrated circuit structure includes a second interconnect structure disposed over the first interconnect structure, and a second semiconductor substrate disposed over the second interconnect structure. The second semiconductor substrate has a total thickness ranging from approximately 0.5 microns to approximately 9 microns, and a total thickness variation or height variation being less than 0.3 microns and greater than 100 angstroms.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning-like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method comprising:

positioning a work piece on a face of a work piece support, wherein the face of the work piece support includes a plurality of temperature control zones;

measuring a plurality of pre-etch surface heights at a plurality of sites on the work piece, wherein the plurality of sites on the work piece correspond to the plurality of temperature control zones, respectively, on the face of the work piece support, wherein a first site of the plurality of pre-etch surface heights has a first height and a second site of the plurality of pre-etch surface heights has a second height, the first height being greater than the second height;

heating a first zone of the temperature control zones to a first target temperature based on the measured plurality of pre-etch surface heights;

while the first zone is being heated, concurrently cooling a second zone of the temperature control zones to a second target temperature based on the measured plurality of pre-etch surface heights, where the second target temperature is lower than the first target temperature;

carrying out a first dry etch while the first zone is heated to the first target temperature and the second zone is concurrently cooled to the second target temperature; wherein the first dry etch reduces the first height of the first site to a third height and reduces the second height of the second site to a fourth height, wherein the third height is less than the fourth height; and positioning a nozzle over a site of the plurality of sites based on a surface height of the site, and dispensing a liquid etchant through the nozzle to etch the site while some of the plurality of sites are free from the liquid etchant.

2. The method of claim 1, further comprising:

determining a post-etch surface topography for the work piece by measuring a plurality of post-etch surface heights at the plurality of sites on the work piece.

3. The method of claim 2, further comprising:

determining whether a plurality of measured post-etch surface heights in the post-etch surface topography fall within a predetermined acceptable range; and when the plurality of measured post-etch surface heights in the post-etch surface topography fall outside the predetermined acceptable range, then heating or cooling the plurality of temperature control zones, respectively, to a second plurality of temperatures, respectively, wherein the second plurality of temperatures are based on the measured plurality of post-etch surface heights, respectively, and carrying out a second dry etch while the plurality of temperature control zones are at the second plurality of temperatures, respectively.

4. The method of claim 1, further comprising:

prior to determining the plurality of pre-etch surface heights for the work piece, removing at least 95% of an initial thickness of the work piece to provide the work piece with a reduced thickness of between 2 micrometers and 10 micrometers, wherein the work piece with the reduced thickness includes the plurality of pre-etch surface heights whereby a total height variation of the work piece ranges between 0.1 micrometers and 0.5 micrometers.

5. The method of claim 1, wherein the work piece is a part of a three-dimensional integrated circuit including at least two semiconductor substrates.

6. The method of claim 1, wherein heating of the first zone and cooling of the second zone includes predicting a temperature distribution of the work piece at the plurality of sites based on the heating and the cooling.

7. The method of claim 1, further comprising:

carrying out a second dry etch after the first dry etch to provide an etched-back surface topography of substantially uniform height;

wherein each of the first site and the second site has a fifth height in the etched-back surface topography and wherein the fifth height is less than the third height.

8. The method of claim 1, wherein the work piece comprises:

a first integrated circuit structure including a first semiconductor substrate and a first interconnect structure, the first interconnect structure including a dielectric structure, and a plurality of metal lines stacked over one another and connected to one another through contacts and vias in the first interconnect structure;

a second integrated circuit structure including a second interconnect structure disposed over the first interconnect structure, and a second semiconductor substrate disposed over the second interconnect structure; and wherein the second semiconductor substrate has a total thickness variation or height variation being less than 0.3 microns and greater than 100 angstroms.

9. The method of claim 1, wherein the work piece comprises monocrystalline silicon.

10. A method comprising:

providing a work piece support configured to hold a semiconductor wafer, wherein the work piece support includes a plurality of temperature control zones, each temperature control zone of the work piece support including a heating element and a cooling element;

determining a pre-etch surface topography for the semiconductor wafer by measuring a plurality of pre-etch surface heights or thicknesses at a plurality of sites on the semiconductor wafer, wherein the plurality of sites on the semiconductor wafer correspond to the plurality of temperature control zones on the work piece support;

heating different heating elements selected from the plurality of temperature control zones to different respective target temperatures that are each greater than a baseline temperature of the semiconductor wafer, wherein the different heating elements are selected based on the measured plurality of pre-etch surface heights or thicknesses;

while heating the different heating elements to the different respective target temperatures, cooling different cooling elements selected from the plurality of temperature control zones to different target temperatures that are each less than the baseline temperature of the semiconductor wafer, wherein the different cooling elements are selected based on the measured plurality of pre-etch surface heights or thicknesses and correspond to different temperature control zones than the heating elements that are being heated;

carrying out a first dry etch while the different heating elements are heated and the different cooling elements are cooled; and positioning a nozzle over a site of the plurality of sites based on a surface height of the site, and dispensing a liquid etchant through the nozzle to etch the site while some of the plurality of sites are free from the liquid etchant, and the semiconductor wafer is stationary with respect to the work piece support.

11. The method of claim 10, further comprising:

prior to determining the pre-etch surface topography for the semiconductor wafer, removing at least 95% of an initial thickness of the semiconductor wafer to provide the semiconductor wafer with a reduced thickness of between 2 micrometers and 10 micrometers, wherein the semiconductor wafer with the reduced thickness includes the pre-etch surface topography whereby a total height or thickness variation of the semiconductor wafer ranges between 0.1 micrometers and 0.5 micrometers.

12. The method of claim 10, wherein the semiconductor wafer is a part of a three-dimensional integrated circuit including at least two semiconductor substrates.

13. The method of claim 10:

wherein the plurality of pre-etch surface heights or thicknesses includes a first site having a first height and a second site having a second height on one side of the first site, the first height being less than the second height;

wherein the first dry etch reduces the first height of the first site to a third height and reduces the second height of the second site to a fourth height, wherein the fourth height is less than the third height.

14. The method of claim 13, further comprising:

carrying out a second dry etch after the first dry etch to provide an etched-back surface topography of substantially uniform height;

wherein each of the first site and the second site have a fifth height in the etched-back surface topography and where the fifth height is less than the third height.

15. A method comprising:

positioning a work piece on a face of a wafer chuck, wherein the face of the wafer chuck includes a plurality of temperature control zones;

measuring a plurality of pre-etch surface heights or thicknesses at a plurality of sites on the work piece, wherein the plurality of sites on the work piece are arranged in a plurality of rows and a plurality of columns and correspond to the plurality of temperature control zones, respectively, on the face of the wafer chuck, the sites of a column having outer edges that are aligned in a first direction, and the sites of a row having outer edges that are aligned in a second direction that is perpendicular to the first direction;

heating a first zone of the temperature control zones to a first target temperature based on the measured plurality of pre-etch surface heights or thicknesses;

while the first zone is being heated, concurrently cooling a second zone of the temperature control zones to a second target temperature based on the measured plurality of pre-etch surface heights or thicknesses, where the second target temperature is lower than the first target temperature;

carrying out a first dry etch while the first zone is heated to the first target temperature and the second zone is concurrently cooled to the second target temperature; and positioning a nozzle over a site of the plurality of sites based on a surface height of the site, and dispensing a liquid etchant through the nozzle to etch the site while some of the plurality of sites are free from the liquid etchant, and the work piece is stationary with respect to the wafer chuck.

16. The method of claim 15, further comprising:

determining a post-etch surface topography for the work piece by measuring a plurality of post-etch surface heights at the plurality of sites on the work piece.

17. The method of claim 16, further comprising:

determining whether a plurality of measured post-etch surface heights in the post-etch surface topography fall within a predetermined acceptable range; and when the plurality of measured post-etch surface heights in the post-etch surface topography fall outside the predetermined acceptable range, then heating or cooling the plurality of temperature control zones, respectively, to a second plurality of temperatures, respectively, wherein the second plurality of temperatures are based on the measured plurality of post-etch surface heights, respectively, and carrying out a second dry etch while the plurality of temperature control zones are at the second plurality of temperatures, respectively.

18. The method of claim 15, further comprising:

prior to determining the plurality of pre-etch surface heights or thicknesses for the work piece, removing at least 95% of an initial thickness of the work piece to provide the work piece with a reduced thickness of between 2 micrometers and 10 micrometers, wherein the work piece with the reduced thickness includes the plurality of pre-etch surface heights or thicknesses whereby a total height or thickness variation of the work piece ranges between 0.1 micrometers and 0.5 micrometers.

19. The method of claim 15, wherein prior to the first dry etch, a first site on the work piece has a first height and a second site on the work piece has a second height, the first height being greater than the second height; and wherein the first dry etch reduces a height of the first site from the first height to a third height and reduces a height of the second site from the second height to a fourth height, wherein the third height is less than the fourth height.

20. The method of claim 19, further comprising:

carrying out a second dry etch after the first dry etch to provide an etched-back surface topography of substantially uniform height;

wherein each of the first site and the second site have a fifth height in the etched-back surface topography and where the fifth height is less than the third height.

* * * * *